US009705050B2

(12) United States Patent
Choi

(10) Patent No.: US 9,705,050 B2
(45) Date of Patent: Jul. 11, 2017

(54) PHOSPHOR SHEET, LIGHT-EMITTING DEVICE HAVING THE PHOSPHOR SHEET AND METHOD OF MANUFACTURING THE SAME

(71) Applicant: SEOUL SEMICONDUCTOR CO., LTD., Ansan-si (KR)

(72) Inventor: Hyuck Jung Choi, Ansan-si (KR)

(73) Assignee: Seoul Semiconductor Co., Ltd., Ansan-si (KR)

(*) Notice: Subject to any disclaimer, the term of this patent is extended or adjusted under 35 U.S.C. 154(b) by 0 days.

(21) Appl. No.: 14/982,935

(22) Filed: Dec. 29, 2015

(65) Prior Publication Data

US 2016/0111607 A1 Apr. 21, 2016

Related U.S. Application Data

(63) Continuation of application No. 14/455,176, filed on Aug. 8, 2014, now Pat. No. 9,231,173, which is a
(Continued)

(30) Foreign Application Priority Data

Sep. 29, 2010 (KR) .................. 10-2010-0094299

(51) Int. Cl.
*H01L 33/50* (2010.01)
*H01L 23/544* (2006.01)
*H01L 27/15* (2006.01)

(52) U.S. Cl.
CPC .......... *H01L 33/502* (2013.01); *H01L 23/544* (2013.01); *H01L 27/156* (2013.01);
(Continued)

(58) Field of Classification Search
CPC .......................... H01L 33/502; H01L 27/156
See application file for complete search history.

(56) References Cited

U.S. PATENT DOCUMENTS 6,373,188 B1 4/2002 Johnson et al.
6,650,044 B1 11/2003 Lowery
(Continued)

FOREIGN PATENT DOCUMENTS

JP 2005-191197 7/2005
KR 10-2009-0117002 11/2009
(Continued)

OTHER PUBLICATIONS

Non-Final Office Action in U.S. Appl. No. 13/247,294 dated Jun. 11, 2013.
(Continued)

*Primary Examiner* — Marc Armand
(74) *Attorney, Agent, or Firm* — H.C. Park & Associates, PLC

(57) ABSTRACT

A light-emitting device includes a substrate including a first electrode and a second electrode, a light-emitting diode (LED) chip electrically connected to the first and the second electrodes, and a phosphor sheet disposed on an upper surface of the LED chip, a first transparent part disposed under the phosphor sheet, and a second transparent part disposed between the phosphor sheet and the LED chip. The first transparent part contacts the second transparent part.

17 Claims, 7 Drawing Sheets

Related U.S. Application Data continuation of application No. 13/247,294, filed on Sep. 28, 2011, now Pat. No. 8,803,175.

(52) U.S. Cl.
CPC .. *H01L 33/505* (2013.01); *H01L 2224/48091* (2013.01); *H01L 2224/48463* (2013.01); *H01L 2224/73265* (2013.01); *Y10T 428/24752* (2015.01)

(56) References Cited

U.S. PATENT DOCUMENTS

| | | |
|---|---|---|
| 7,157,745 B2 | 1/2007 | Blonder et al. |
| 2005/0110032 A1 | 5/2005 | Saito et al. |
| 2005/0224830 A1* | 10/2005 | Blonder ............... H01L 33/507 257/100 |
| 2005/0269582 A1 | 12/2005 | Mueller et al. |
| 2008/0122343 A1* | 5/2008 | Maruyama ............. H01J 1/63 313/503 |
| 2008/0173889 A1 | 7/2008 | Shylo et al. |
| 2008/0290351 A1 | 11/2008 | Ajiki et al. |
| 2009/0095960 A1 | 4/2009 | Murayama |
| 2009/0189513 A1 | 7/2009 | Lane |
| 2010/0270566 A1 | 10/2010 | Cheng et al. |
| 2011/0215355 A1 | 9/2011 | van de Ven et al. |
| 2012/0068209 A1 | 3/2012 | Andrews |

FOREIGN PATENT DOCUMENTS

| | | |
|---|---|---|
| KR | 10-2010-0021891 | 2/2010 |
| KR | 10-2010-0036029 | 4/2010 |

OTHER PUBLICATIONS

Final Office Action in U.S. Appl. No. 13/247,294 dated Dec. 10, 2013.
Notice of Allowance in U.S. Appl. No. 13/247,294 dated Apr. 1, 2014.
Non-Final Office Action in U.S. Appl. No. 14/455,176 dated May 12, 2015.
Notice of Allowance in U.S. Appl. No. 14/455,176 dated Aug. 31, 2015.

* cited by examiner

PHOSPHOR SHEET, LIGHT-EMITTING DEVICE HAVING THE PHOSPHOR SHEET AND METHOD OF MANUFACTURING THE SAME

CROSS-REFERENCE TO RELATED APPLICATIONS

The present application is a continuation of U.S. patent application Ser. No. 14/455,176, filed on Aug. 8, 2014, now issued as U.S. Pat. No. 9,231,173, which is a continuation of U.S. patent application Ser. No. 13/247,294, filed on Sep. 28, 2011, now issued as U.S. Pat. No. 8,803,175, which claim priority from Korean Patent Application No. 10-2010-0094299, filed on Sep. 29, 2010, which are all hereby incorporated by reference for all purposes as if fully set forth herein.

BACKGROUND

Field

Exemplary embodiments of the present invention relates to a phosphor sheet, a light-emitting device having the phosphor sheet, and a method of manufacturing the same.

Discussion of the Background

A light-emitting diode (LED) is a semiconductor light-emitting device that emits light when electrons and holes are re-combined with each other in a P-N junction structure, by applying current. LEDs operate at a low voltage and have a long lifespan and low cost characteristics. Conventionally, LEDs have mainly been used in a limited number of applications. However, recently, LEDs have been used in various applications, such as in display devices, illumination devices, vehicle lights, projectors, or the like, due to the development of an industrial technology, particularly, the development of an information display technology and semiconductor technology.

A light-emitting device may implement white light by combining an LED chip with a phosphor. For example, the light-emitting device may implement white light by a combination of a blue LED chip made of a semiconductor component emitting light having a wavelength of 430 to 480 nm, and a yellow yttrium aluminum garnet (YAG)-based phosphor capable of emitting yellow light when excited by the light of the blue LED chip.

Conventional light-emitting devices have mainly used a scheme of applying a resin composition, in which a yellow phosphor and an epoxy resin or a silicon resin are mixed, to an upper portion of a blue LED chip, or sealing the LED chip using the resin composition. However, the qualities of the emitted light are significantly affected by the application of a method of applying the phosphor and operating conditions of the LED chip. In addition, there are many difficulties in reproducing the same white light, luminance is irregular, and color reproduction is deteriorated, due to a mixing ratio of a phosphor and a resin, thermal instability of this resin, irregular deposition of a phosphor at the time of curing of a resin composition, and the like.

Therefore, instead of a method of molding a resin containing a phosphor, a method of disposing a layer or a sheet including a phosphor on an upper portion of an LED chip has been recently attempted. However, when the phosphor sheet is formed to have the same area as that of the upper portion of the LED chip, light emitted from a side of the LED chip may not be efficiently incident to the phosphor sheet. When the phosphor sheet is formed to be larger than the upper portion of the LED chip, in order to solve this problem, it is not easy to align the LED chip and the phosphor sheet with each other, such that the color of emitted light is not uniform, due to the misalignment. In addition, when the light emitted from the LED chip is diffusion-reflected, due to collision with phosphor particles dispersed in an inner portion of the phosphor sheet, back to the LED chip, light emission efficiency is reduced.

SUMMARY

Exemplary embodiments of the present invention provide a light-emitting device including a phosphor sheet is disposed on an upper surface of a light-emitting diode (LED) chip, the phosphor sheet being aligned to emit uniform white light.

Exemplary embodiments of the present invention provide a light-emitting device capable of reducing light that is lost due to internal reflection from phosphor particles in a phosphor sheet.

Additional features of the invention will be set forth in the description which follows, and in part will be apparent from the description, or may be learned by practice of the invention.

According to an exemplary embodiment of the present invention, there is provided a light emitting device including: a substrate; a light emitting diode (LED) chip disposed on the substrate; and a phosphor sheet disposed on an upper portion of the LED chip and including alignment members formed on a lower surface thereof.

According to another exemplary embodiment of the present invention, there is provided a phosphor sheet including a mixture of a phosphor and a resin. The phosphor sheet also including: at least one alignment member formed on a lower surface thereof, wherein the alignment member contacts an LED chip.

According to still another exemplary embodiment of the present invention, there is provided a method of manufacturing a light emitting device, the method including: disposing at least one LED chip on a substrate; and adhering a phosphor sheet to an upper portion of the LED chip, the phosphor sheet including an alignment member formed on a lower surface thereof, wherein the alignment member is protruded from the lower surface of the phosphor sheet to thereby contact a portion of the LED chip.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
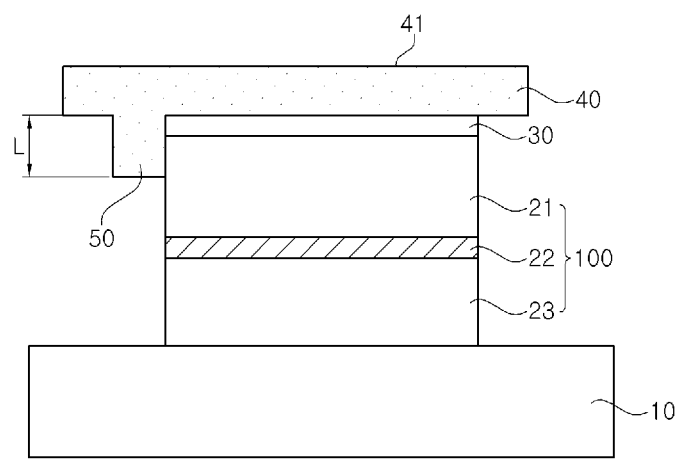
FIG. 1 is a cross-sectional view describing a light-emitting device, according to an exemplary embodiment of the present invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

FIG. 1 is a cross-sectional view of a light-emitting device, according to an exemplary embodiment of the present invention. FIGS. 2A to 3D are views showing various alignment members provided on a phosphor sheet, according to exemplary embodiments of the present invention.

Referring to FIG. 1, the light-emitting device includes a lower substrate 10, a light-emitting diode (LED) chip 100, a phosphor sheet 40 disposed on an upper portion of the LED chip 100, and an adhesive member 30. However, for simplifying the drawing, a detailed configuration of the LED chip 100 is not shown.

Here, the lower substrate 10 may be any substrate, as long as the LED chip 100 may be mounted thereon at a high density. The lower substrate 10 may include, for example, alumina, quartz, calcium zirconate, forsterite, SiC, graphite, fused silica, mullite, cordierite, zirconia, beryllia, aluminum nitride, low temperature co-fired ceramic (LTCC), or the like. However, the lower substrate 10 is not limited thereto. A ceramic may be used as a multi-layer ceramic package (MLP), by forming metal conductor wiring patterns thereon and using a firing process.

The lower substrate 10 may include patterned electrodes (not shown) formed thereon. The electrodes may include an anode electrode and a cathode electrode and may be formed of a highly conductive material, such as copper or aluminum. The anode and cathode electrodes correspond to an n-type electrode (not shown) and a p-type electrode (not shown) of the LED chip 100, and are spaced apart from each other for electrical insulation.

The LED chip 100 is a vertical LED and includes an n-type layer 21, an active layer 22, and a p-type layer 23. The LED Chip 100 may be formed by growing a nitride semiconductor material on a growth substrate (not shown), through a known deposition process, such as a metal organic chemical vapor deposition (MOCVD) method, a molecular beam epitaxy (MBE) method, or the like. More specifically, the n-type layer 21 and the p-type layer may be formed of a GaN film, and the active layer 22 may be formed of an InGaN film.

The light-emitting diode chip 100 may be, for example, a blue light-emitting LED chip but is not limited thereto. The light-emitting diode chip 100 may include a semiconductor component that emits light having a wavelength of 430 to 480 nm. However, an LED chip emitting another color of light may be used as the LED chip 100, and the present invention is not limited to a specific LED chip. Further, aspects of the present invention may also be applied to a horizontal LED.

In addition, the phosphor sheet 40 may include a phosphor that is excited by blue light emitted from the LED chip 100 and that emits yellow light. However, different phosphors may be used, in accordance with the color of light emitted by the LED chip 100, so long as white light is produced. The phosphor sheet 40 will be described in detail below.

The adhesive member 30 is interposed between the LED chip 100 and the phosphor sheet 40, to adhere the LED chip 100 and the phosphor sheet 40 to each other. That is, after the adhesive member 30 is applied to an upper portion of the LED chip 100 or a rear surface of the phosphor sheet 40, the phosphor sheet 40 may be adhered directly to the LED chip 100.

The adhesive member 30 may include a transparent adhesive, such as an ultraviolet (UV) curable resin, a thermosetting resin, a sealant, or the like. The refractive index of the adhesive member 30 may have a value between a refractive index of the LED chip 100 and a refractive index of the phosphor sheet 40, thereby making it possible to reduce the total internal reflection of the LED chip 100. Furthermore, although not shown, an outer surface of the phosphor sheet 40 (opposite to a surface on which the phosphor sheet 40 is adhered to the adhesive member 30), that is, an emitting surface 41 of the phosphor sheet 40, may be roughened, in order to reduce the total internal reflection of the LED chip 100. The phosphor sheet 40 may be manufactured in a slurry form, by mixing a phosphor and a resin with each other. The resin may be a resin having high hardness and reliability. For example, the resin may be a thermosetting resin having transparency, such as, for example, a silicon resin, an epoxy resin, a glass, a glass ceramic, a polyester resin, an acrylic resin, an urethane resin, a nylon resins, a polyamide resin, a polyimide resin, a vinyl chloride resin, a polycarbonate resin, a polyethylene resin, a Teflon resin, a polystyrene resin, a polypropylene resin, a polyolefin resin, or the like. However, the resin is not limited thereto.

A single type of phosphor may be included in the resin or a mixture of multiple phosphors may be used. As described above, a conventional light-emitting device is manufactured by burying a blue/near ultraviolet LED in an epoxy phosphor mixture, such that the resultant device has low thermal stability and light stability. On the other hand, the phosphor of the phosphor sheet 40 has excellent thermal stability, light stability, and luminance.

The present phosphor may be any suitable phosphor for wavelength conversion. The phosphor may include at least one selected from a group consisting of, for example, $(Ba, Sr, Ca)_2SiO_4:Eu^{2+}$, $YAG((Y, Gd)_3(Al, Ga)_5O_{12}:Ce^{3+})$ based phosphor, $TAG((Tb, Gd)_3(Al, Ga)_5O_{12}:Ce^{3+})$ based phosphor, $(Ba, Sr, Ca)_3SiO_5:Eu^{2+}$, $(Ba, Sr, Ca)MgSi_2O_6: Eu^{2+}, Mn^{2+}$, $(Ba, Sr, Ca)_3MgSi_2O_8: Eu^{2+}, Mn^{2+}$ and $(Ba, Sr, Ca)MgSiO_4: Eu^{2+}, Mn^{2+}$. The phosphor sheet 40 may have various thicknesses. When the phosphor sheet 40 has an excessively thin thickness, it may be difficult to uniformly distribute the phosphor in an inner portion of the phosphor sheet 40, such that it is difficult to produce white light. On the other hand, when the phosphor sheet 40 has an excessively thick thickness, the luminous intensity (cd) may be reduced. Therefore, it is possible to appropriately adjust a thickness of the phosphor sheet, in consideration of these factors.

The phosphor sheet 40 may be manufactured by press-molding a mixture (slurry) of the resin and the phosphor, in a mold, so as to have a sheet shape as described above. However, the present invention is not limited thereto. That is, the phosphor sheet 40 may be manufactured by supplying the slurry to an extruder and pushing the slurry from the mold by an extrusion molding method. In the alternative, the phosphor sheet 40 may be manufactured using a doctor blade method. Therefore, the phosphor sheet 40 may be manufactured by any suitable method of forming a sheet.

The phosphor sheet plate may be cut to have a desired size and shape through, for example, a sawing or scribing process. That is, the phosphor sheet 40 may be cut at a desired size, so as to be disposed on the upper portion of the LED chip 100. The cut phosphor sheet 40 may be then adhered to the upper portion of the LED chip 100.

The phosphor sheet includes an alignment member 50 to align the phosphor sheet 40 and the LED chip 100, in order to dispose the phosphor sheet 40 at a correct position on the upper surface of the LED chip 100. That is, at least one alignment member 50 is formed on the rear surface of the phosphor sheet 40, thereby making it possible to properly align the LED chip 100 and the phosphor sheet 40.

Figure 8:
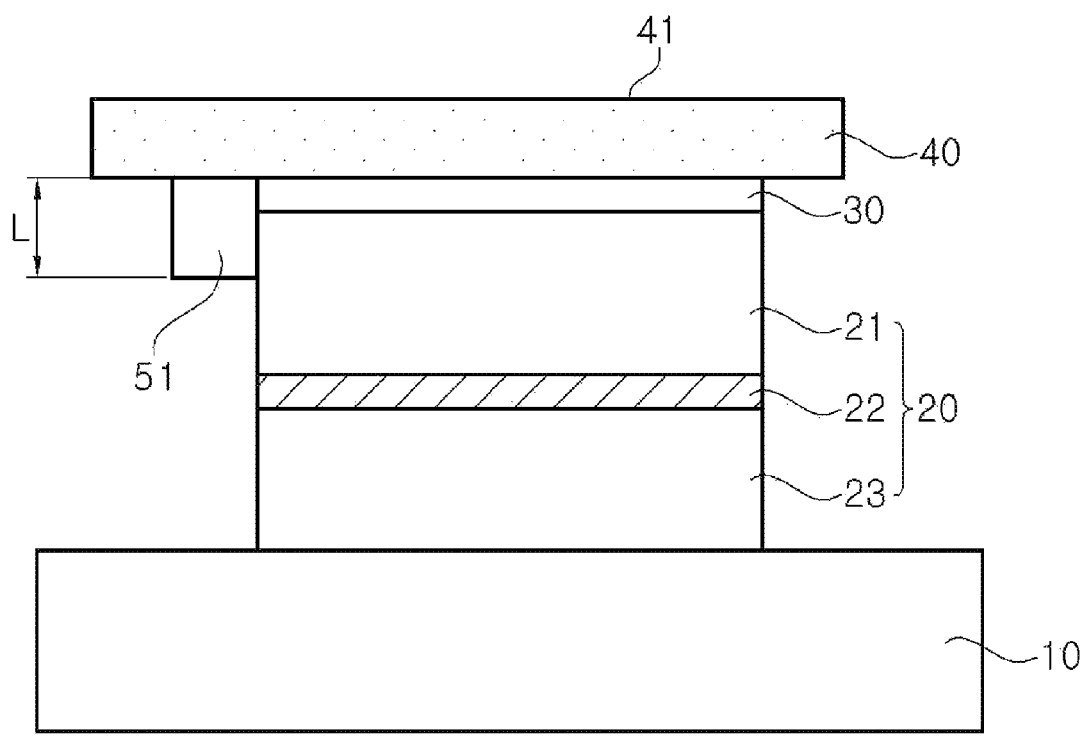
FIG. 8 is a cross-sectional view describing a light-emitting device, according to an exemplary embodiment of the present invention.

The alignment member 50 may be formed integrally with the phosphor sheet 40 at the time of manufacturing of the phosphor sheet 40. As shown in FIG. 8, another embodiment similar to the embodiment of FIG. 1 includes a separate alignment member 51 that may be formed and then adhered to the rear surface of the phosphor sheet 40. When the alignment member 50 is formed integrally with the phosphor sheet 40, the alignment member 50 may be made of the same material as the phosphor sheet 40. The alignment member 51 may be made of a transparent resin, so as not to interfere with the light emitted from the LED chip 100. The alignment member 50/51 contacts the upper portion of the LED chip 100, when the phosphor sheet 40 is moved relative to the LED chip 100, to thereby align the phosphor sheet 40 on the LED chip 100.

The height or length L of the alignment member 50 from a surface of the phosphor sheet 40 may be shorter than a distance from the upper surface of the LED chip 100 to the active layer 22, in order to avoid a phenomenon in which the light emitted from the active layer 22 of the LED chip 100 is interfered with by the alignment member 50. Although the alignment member 50 is shown protruding from the rear surface of the phosphor sheet 40, the alignment member 50 may be formed have various shapes and may be disposed at various positions, as shown in FIGS. 2 and 3. However, the present invention is not limited to the shown shapes and position.

FIGS. 2A to 3D are plan views showing the rear surface of the phosphor sheet 40, wherein a dotted line indicates a position at which the LED chip 100 is adhered to the phosphor sheet 40. Referring to FIGS. 2A to 3D, the alignment member 50 may be disposed in the vicinity of at least one edge of the rear surface of the phosphor sheet 40 (See FIGS. 2A to 2C and 3A to 3C) or may be formed to be extended along at least one side of the phosphor sheet 40 (See FIGS. 2D and 3D).

Figure 2A:
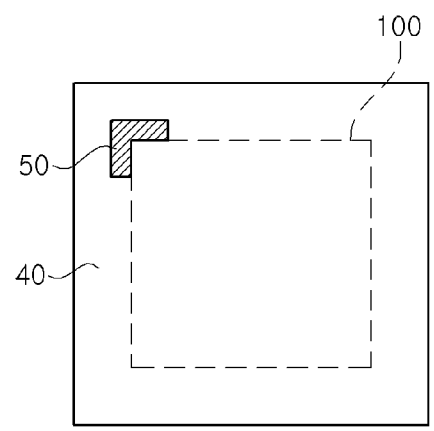
FIGS. 2A, 2B, 2C, and 2D are views showing various alignment members provided on a phosphor sheet, according to exemplary embodiments of the present invention.
Figure 2B:
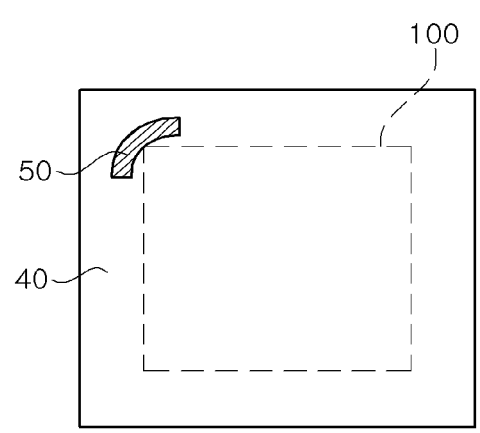
Figure 2C:
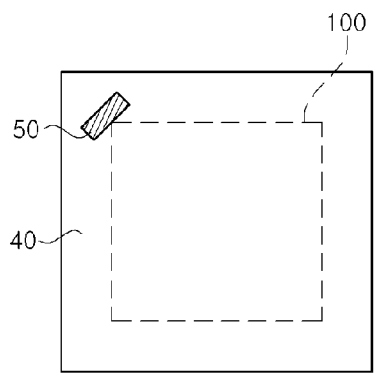
Figure 2D:
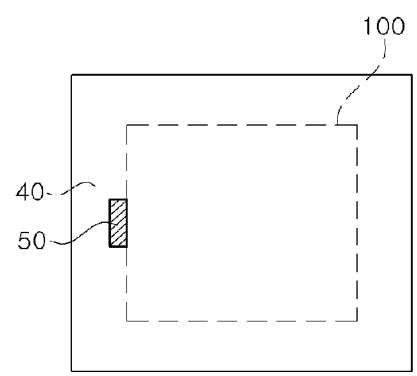

That is, the alignment member 50 may be L-shaped, as shown in FIG. 2A, may be arc-shaped, as shown in FIG. 2B, or may be rectangular as shown in FIGS. 2C and 2D. The alignment member 50 may be formed on the rear surface of the phosphor sheet 40, adjacent to an edge of the phosphor sheet 40, or may be disposed along one side thereof, to thereby guide the phosphor sheet 40.

Figure 3A:
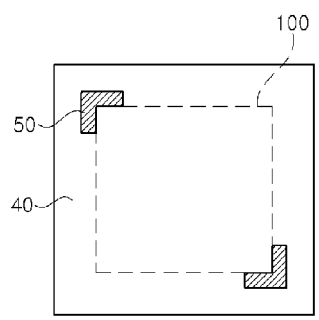
FIGS. 3A, 3B, 3C, and 3D are views showing various alignment members provided on a phosphor sheet, according exemplary embodiments of the present invention.
Figure 3B:
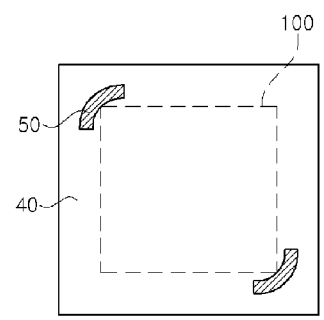
Figure 3C:
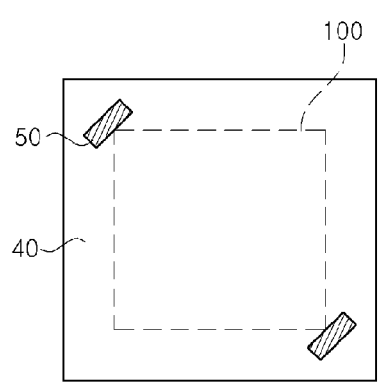
Figure 3D:
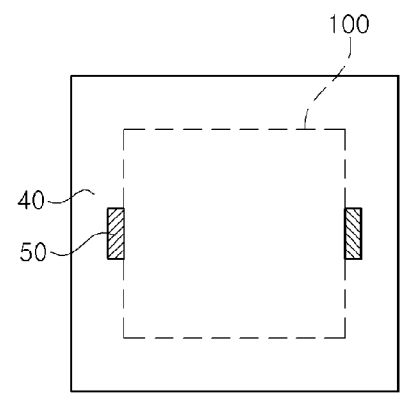

Alternately, as shown in FIGS. 3A to 3D, at least one pair of alignment members 50 having the same shape may be formed. Here, a pair of alignment members 50 may be disposed diagonally, so as to be adjacent to opposing corners of the LED chip 100, as shown in FIGS. 3A to 3C. A pair of alignment members 50 may be disposed on opposing sides of the LED chip 100, as shown in FIG. 3D, or may be disposed along two adjacent sides of the LED chip 100 (not shown). In addition, two pairs of alignment members 50 may be formed (not shown). More specifically, each of the alignment members 50 may have the same shape and may be disposed at corresponding corners or sides of the LED chip 100.

Since the alignment member 50 is formed on the rear surface of the phosphor sheet 40, when the LED chip 100 and the phosphor sheet 40 are adhered to each other by the adhesive member 30, the alignment member 50 may guide the position of the phosphor sheet 40, by contacting a portion of the LED chip 100. Therefore, it is possible to prevent the misalignment of the phosphor sheet 40, so that a uniform color of light is emitted from the LED chip 100.

Referring to FIGS. 4 to 7, light-emitting devices according to other embodiments of the present invention will be described. However, a description of the same portion as that of the above-mentioned embodiment will be omitted.

Figure 4:
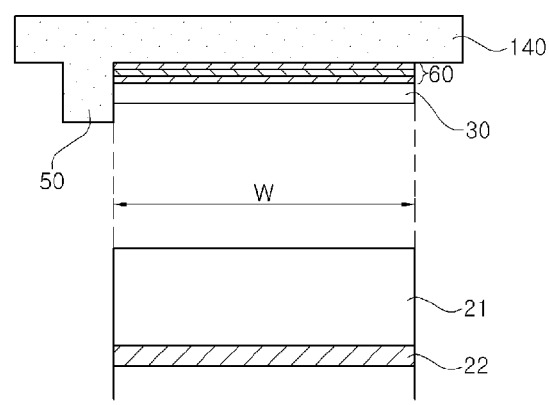
FIGS. 4, 5, 6A, 6B, 6C, and 7 are cross-sectional views describing light-emitting devices, according to exemplary embodiments of the present invention.

FIG. 4 is a cross-sectional view describing a light-emitting device, according to another embodiment of the present invention. Referring to FIG. 4, the light-emitting device includes a phosphor sheet 140 including a reflective member 60 formed thereon.

The reflective member 60 transmits light emitted from the LED chip 100. In addition, the reflective member reflects light emitted from the phosphor sheet 140, thereby increasing light extraction efficiency.

The reflective member 60 may be formed of an insulating material having a higher reflectivity than Al or Ag. For example, the reflective member may include Si, Ti, Ta, Nb, In, and/or Sn. In addition, the reflective member 60 may be formed by alternately stacking at least two layers of $Si_xO_yN_z$, $Ti_xO_y$, $Ta_xO_y$, and/or $Nb_xO_y$. The reflective member 60 may be a distributed Bragg reflector (DBR).

The DBR adjusts the optical thicknesses of a high refractive index layer and a low refractive index layer that are alternately stacked, thereby making it possible to maximize reflectivity to light having a specific wavelength. Therefore, the DBR of which the reflectivity is optimized according to a wavelength of light generated in the active layer 22 is formed, thereby making it possible to tune the reflective member 60 to reflect, for example, ultraviolet light, visible light, or infrared light.

The reflective member 60 may be formed on the phosphor sheet 140 in a position corresponding to a position at which the LED chip 100 is formed. That is, the reflective member 60 is formed to have the same width as a width w of the upper surface of the LED chip 100, thereby making it possible to reduce a material cost. Further, the adhesive member 30 as well as the reflective member 60 may also be formed to have the same size and shape as the corresponding surface of the LED chip 100.

Figure 5:
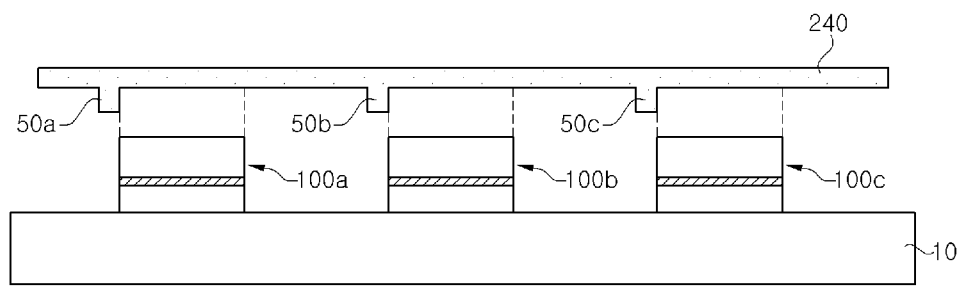

FIG. 5 is a cross-sectional view of a light-emitting device, according to still another exemplary embodiment of the present invention. Referring to FIG. 5, the light-emitting device includes a single phosphor sheet 240 disposed on upper portions of a plurality of LED chips 100a, 100b, and 100c. While three LED chips are shown, the present invention is not limited to any particular number of LED chips.

Although not shown for simplification of the drawing, the light-emitting device may also further include reflective members and adhesive members that are formed on a lower portion of the phosphor sheet 240. In this case, the reflective members and the adhesive members are formed only at areas corresponding to positions at which the plurality of LED chips 100a, 100b, and 100c are formed, thereby making it possible to reduce a material costs. In addition, a phosphor dispersed in the phosphor sheet 240 may be dispersed only to positions corresponding to the plurality of LED chips 100a, 100b, and 100c, thereby making it possible to further reduce the material costs.

Referring to FIG. 5, the phosphor sheet 240 includes a plurality of alignment members 50a, 50b, and 50c that are regularly spaced from each other. The alignment members 50a, 50b, and 50c may be formed to have the same shape and size and be disposed at positions corresponding to the LED chips 100a, 100b, and 100c, in the same scheme as shown in FIGS. 2A to 3D. Further, similar to the above-mentioned embodiments, the alignment members 50a, 50b, and 50c may be formed integrally with the phosphor sheet 240 during a process of manufacturing the phosphor sheet 240, or may be separately manufactured and then adhered to the phosphor sheet 240.

Although FIG. 5 shows that each of the alignment members 50a, 50b, and 50c corresponds to one of the LED chips 100a, 100b, and 100c, in an one-to-one relationship, one or more of the alignment members 50a, 50b, and 50c may be omitted, such that the alignment sheet 240 includes less than one alignment member per LED chip. For example, the phosphor sheet 240 may be aligned with the LED chips 100a, 100b, and 100c, even if the phosphor sheet 240 includes only one of the alignment members 50a, 50b, and 50c.

Once the phosphor sheet 240 aligned with and adhered to the LED chips 100a, 100b, and 100c, the lower substrate 10 and the phosphor sheet 240 are cut to separate the LED chips. An alignment member may not be included in at least some of the separated LED chips 100a, 100b, and 100c.

That is, a method of manufacturing a light-emitting device, according to an exemplary embodiment of the present invention, a plurality of light-emitting devices may be simultaneously manufactured, by disposing the LED chips on the lower substrate 10, aligning the phosphor sheet 240 using at least one alignment member 50, adhering the aligned phosphor sheet 240, and then cutting the resultant into individual LED chip units.

Through this process, it is possible to align the phosphor sheet at a desired position on upper portions of the plurality of LED chips, while reducing an operations and manufacturing time, as compared to a case in which phosphor sheets are disposed on individual LED chips. Accordingly, LED chip units having uniform light emission and low defect rates may be produced.

Figure 6A:
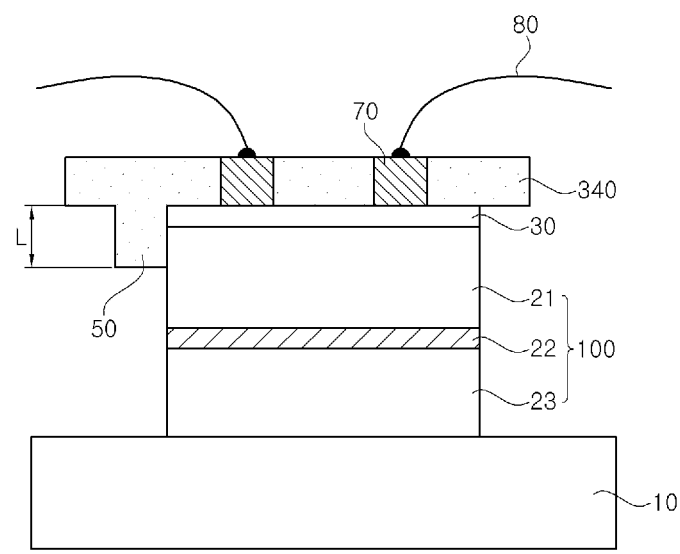

FIG. 6A is a cross-sectional view describing a light-emitting device, according to an exemplary embodiment of the present invention. Referring to FIG. 6, in the light-emitting device includes a phosphor sheet 340 including an alignment member 50, electrodes 70 extending through the phosphor sheet 340, and an LED chip 100 connected to the electrodes 70.

Figure 6B:
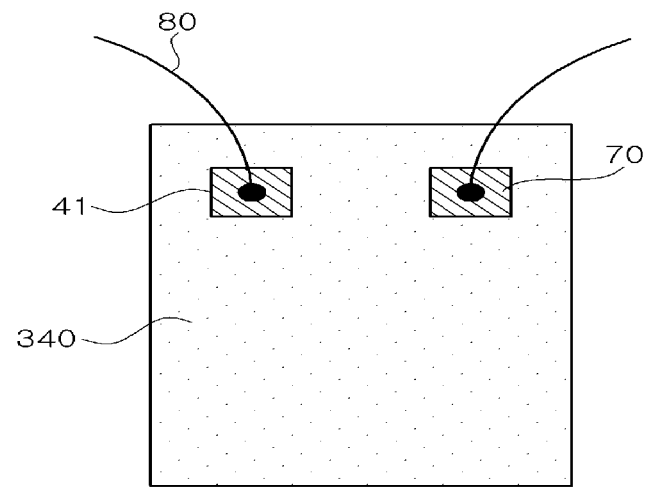
Figure 6C:
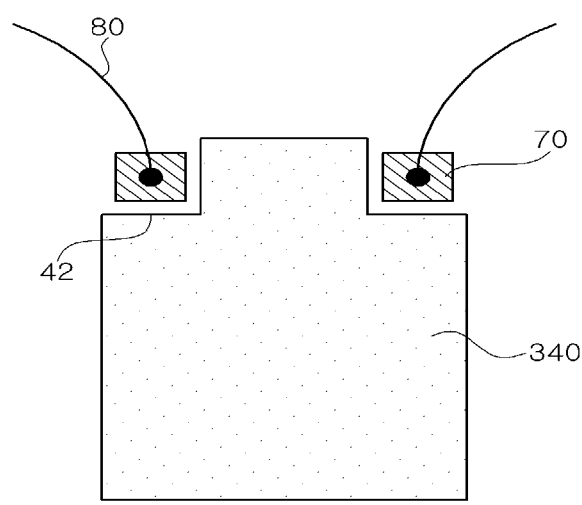

FIGS. 6B and 6B illustrate top plan views of light-emitting devices that include phosphor sheets 340 similar to that of FIG. 6a. As shown in FIG. 6B, the phosphor sheet 340 includes openings 41. As shown in FIG. 6C, the phosphor sheet 340 includes cutouts 42. Electrodes are disposed within the openings 41 and the cutouts 42. Herein, the openings 41 and the cutouts 42 may be referred to as "electrode exposure parts."

Referring to FIG. 6A, the LED chip 100 may be, for example, a vertical LED. In this case, one of the electrodes 70 may be an n-type electrode formed on the upper surface of the LED chip 100, and a p-type electrode (not shown) may be formed on the p-type semiconductor layer 23. While two n-type electrodes 70 are shown, in FIG. 6A, in consideration of an increase in an area of the LED chip 100 or current diffusion, only a single n-type electrode may also be formed. Further, the positions or the number of n-type electrodes 70 may be varied according to various aspects.

If the LED chip 100 is a horizontal LED, n-type and p-type electrodes may be formed on the upper surface of the LED chip 100. Generally, each of a single n-type electrode and a single p-type electrode may be formed on the upper surface of the LED chip 100. However, as an area of the LED chip increase, the number of electrodes may be changed. However, hereinafter, the vertical LED will be mainly described.

The phosphor sheet 340 may be provided with the electrode exposure parts 41 and 42 corresponding to positions and shapes of the n-type electrodes 70, in order not to cause damage to the n-type electrodes 70 or bonding wires 80 connected to the n-type electrodes 70, during a process of adhering the phosphor sheet 340 to the upper surface of the LED chip 100.

More specifically, as shown in FIG. 6B, the phosphor sheet 340 may be provided with the opening 41. Through this configuration, since an upper surface of the n-type electrode 70 of the LED chip 100 may be exposed through the opening 41 formed in the phosphor sheet 340, the bonding wire 80 may be connected to the exposed upper surface of the n-type electrode 70. As a result, the bonding wire 80 may be freely connected to the upper surface of the n-type electrode 70, regardless of how the phosphor sheet 340 is adhered to the LED chip 100. That is, since the bonding wire 80 may be connected to the upper surface of the n-type electrode 70 after the phosphor sheet 340 is adhered to the upper surface of the LED chip 100, wire bonding may be performed without causing damage to the bonding wire 80.

The opening 41 may be formed by irradiating a surface of the phosphor sheet 340 with a laser beam, or be formed by using a punching machine. The opening 41 may also be formed through an additional process, after the phosphor sheet 340 is manufactured. In the alternative, the openings may be formed when manufacturing the phosphor sheet 340. Therefore, the present invention is not limited to a specific method of forming the opening 41.

As shown in FIG. 6C, the cutout 42 is formed at an edge of the phosphor sheet 340. The bonding wire 80 may also be connected to an n-type electrode 70 exposed through the cutout 42, after the phosphor sheet 340 is adhered to the upper surface of the LED chip 100. However, the phosphor sheet 340 may also be adhered to the upper surface of the LED chip 100 after the bonding wire 80 is connected to the exposed n-type electrode 70. Although two cutouts 42 are shown in FIG. 6C, the present invention is not limited thereto. When only a single electrode is formed on the upper portion of the LED chip 100, only one cutout 41 may be formed. In addition, although not shown in the drawing, the reflective member 60 shown in FIG. 4 may be formed on the rear surface of the phosphor sheet 340.

The electrode exposure parts are formed in the phosphor sheet, thereby making it possible to attach the phosphor sheet to the LED chip, without causing damage to the electrode of the LED chip or the bonding wire.

Figure 7:
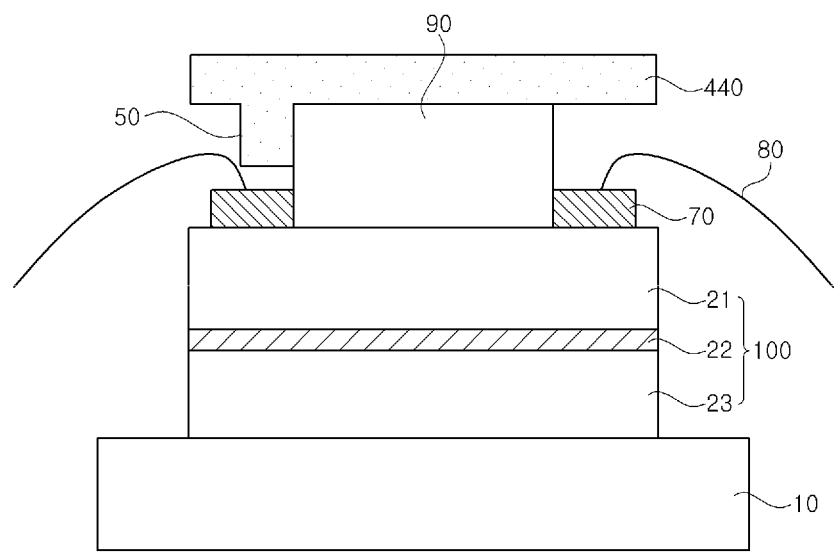

FIG. 7 is a cross-sectional view describing a light-emitting device according to still another exemplary embodiment of the present invention. Referring to FIG. 7, the light-emitting includes a transparent film 90 provided between a phosphor sheet 440 and an LED chip 100 disposed on a substrate 10.

In order to adhere the phosphor sheet 440 to the LED chip 100, without causing damage to an electrode 70 formed on the upper portion of the LED chip 100 or a bonding wire 80 connected to the electrode 70, the electrode exposure parts 41 and/or 42 may also be provided as described above.

However, in order to minimize cracking of the phosphor sheet 440, electrode exposure parts are not formed. Instead, the transparent film 90 is used to adhere the phosphor sheet 440 to the LED chip 100. The transparent film 90 separates the phosphor sheet 340 from the LED chip 100. As a result, damage to the electrode 70 and/or the bonding wire 80 is prevented, without forming electrode exposure parts in the phosphor sheet 440.

The transparent film 90 is adhered to the upper surface of the LED chip 100 by a transparent adhesive member (not shown). The transparent film 90 is made of a transparent material, such as a UV curable resin, a thermosetting resin, a sealant, or the like. The transparent film 90 and the phosphor sheet 440 may include the same resin. The phosphor sheet 440 is spaced apart from the LED chip 100 by the transparent film 90.

That is, the transparent film 90 is interposed between the LED chip 100 and the phosphor sheet 440, such that the phosphor sheet 440 is not adhered directly to the upper portion of the LED chip 100. Thus, the electrode 70 and/or bonding wire 80 may protected from damage during a process of adhering the phosphor sheet 440 to the upper surface of the LED chip 100.

However, a size or a width of the transparent film 90 is disposed on the upper surface of the LED chip 100, except for an area at which the electrode 70 is formed. The thickness of the transparent film 90 may be adjusted, so as not to cause damage to the bonding wire 80. That is, when the transparent film 90 has an excessively thin thickness, there may be a risk of causing damage to the bonding wire 80. Therefore a thickness of the transparent film 90 may be adjusted in consideration of a height of the bonding wire 80.

The above-mentioned reflective member 60 may be formed the phosphor sheet 440. Through this configuration, light extraction efficiency may be increased.

In addition, the phosphor sheet 440 includes an alignment member 50 formed on a rear surface thereof. In the case of the present embodiment, the alignment member 50 may guide a position of the phosphor sheet 440 while contacting the transparent film 90, rather than the LED chip 100.

According to aspects of the present invention, it is possible to align the phosphor sheet at a desired position on the upper portion of the LED chip, without causing damage to the electrode of the LED chip or the bonding wire connected to the electrode, during the process of adhering the phosphor sheet to the upper portion of the LED chip.

According to various embodiments of the present invention, an operation of aligning the phosphor sheet at a desired position on an upper surface of the LED chip is easily performed, and misalignment of the phosphor sheet is prevented, thereby making it possible to provide a light emitting device emitting uniform while light.

In addition, according to various embodiments of the present invention, light reflected from the phosphor within the phosphor sheet toward the LED chip is reflected back toward the outside, thereby making it possible to increase luminance light extraction efficiency of the light emitting device.

It may be understood by those skilled in the art to which the present invention pertains that the present invention may be implemented as other specific forms without changing the spirit or essential feature thereof.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A light-emitting device, comprising:
   a substrate comprising a first electrode and a second electrode;
   a light-emitting diode (LED) chip electrically connected to the first and the second electrodes;
   a phosphor sheet disposed on an upper surface of the LED chip;
   a first transparent part disposed under the phosphor sheet; and
   a second transparent part disposed between the phosphor sheet and the LED chip,
   wherein the first transparent part contacts the second transparent part, and
   wherein the first transparent part has a thickness greater than a thickness of the second transparent part.

2. The light-emitting device of claim 1, wherein the first transparent part contacts at least one of a side and a corner of the LED chip.

3. The light-emitting device of claim 1, wherein the first transparent part extends toward an upper surface of the substrate.

4. The light-emitting device of claim 1, wherein a length of the first transparent part is less than a length of the second transparent part.

5. The light-emitting device of claim 1, wherein a portion of a side of the second transparent part contacts the first transparent part.

6. The light-emitting device of claim 1, wherein the area of the upper surface of the phosphor sheet is greater than the area of the upper surface of the LED chip.

7. The light-emitting device of claim 1, wherein the phosphor sheet has a flat shape.

8. The light-emitting device of claim 1, wherein the second transparent part adheres the LED chip and the phosphor sheet to each other.

9. The light-emitting device of claim 3, wherein the first transparent part extends from a lower surface of the phosphor sheet.

10. A light-emitting device, comprising:
    a substrate;
    light-emitting diode (LED) chips disposed on the substrate and separated from each other;

a phosphor sheet disposed on an upper surface of the LED chips;

first transparent parts disposed under the phosphor sheet; and second transparent parts disposed between the phosphor sheet and the LED chips, wherein the first transparent parts are separated from each other, and the second transparent parts are separated from each other, wherein one of the second transparent parts disposed on one of the LED chips contacts one of the first transparent parts, and wherein the first transparent parts have thicknesses greater than thicknesses of the second transparent parts.

11. The light-emitting device of claim 10, wherein a distance between adjacent first transparent parts is at least equal to a width of one of the LED chips.

12. The light-emitting device of claim 10, wherein a distance between adjacent first transparent parts is at least equal to a distance between adjacent LED chips.

13. The light-emitting device of claim 10, wherein at least one of the first transparent parts contacts at least one of a side and a corner of one of the LED chips.

14. The light-emitting device of claim 10, wherein at least one of the first transparent parts extends toward an upper surface of the substrate.

15. The light-emitting device of claim 10, wherein:
the LED chips comprise a first LED chip; and
a length of one of the second transparent parts disposed on the first LED chip is greater than a length of one of the first transparent parts adjacent to the first LED chip.

16. The light-emitting device of claim 10, wherein:
the LED chips comprise a first LED chip; and
a portion of a side of one of the second transparent parts disposed on the first LED chip contacts one of the first transparent parts.

17. The light-emitting device of claim 10, wherein the area of the upper surface of the phosphor sheet is greater than the sum of the areas of the upper surfaces of the LED chips.

* * * * *